US007713660B2

(12) United States Patent
Kim et al.

(10) Patent No.: US 7,713,660 B2
(45) Date of Patent: May 11, 2010

(54) METHOD FOR MANUFACTURING MANGANESE OXIDE NANOTUBE OR NANOROD BY ANODIC ALUMINUM OXIDE TEMPLATE

(75) Inventors: Hae Jin Kim, Daejeon (KR); Jin Bae Lee, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 210 days.

(21) Appl. No.: 12/084,103

(22) PCT Filed: Oct. 20, 2006

(86) PCT No.: PCT/KR2006/004278

§ 371 (c)(1),
(2), (4) Date: Apr. 25, 2008

(87) PCT Pub. No.: WO2007/049880

PCT Pub. Date: May 3, 2007

(65) Prior Publication Data

US 2009/0142666 A1 Jun. 4, 2009

(30) Foreign Application Priority Data

Oct. 27, 2005  (KR) .................. 10-2005-0101544
Oct. 18, 2006  (KR) .................. 10-2006-0101153

(51) Int. Cl.
*H01M 4/50* (2006.01)
*H01M 4/58* (2006.01)
*C01G 45/02* (2006.01)
*C01G 47/00* (2006.01)
*C01G 57/00* (2006.01)

(52) U.S. Cl. .................. 429/224; 429/231.95; 423/605

(58) Field of Classification Search ................ 429/209, 429/218.1, 224, 231.9, 231.95; 423/605, 423/599, 594.15; 977/773, 811, 948
See application file for complete search history.

(56) References Cited

U.S. PATENT DOCUMENTS

| 6,231,744 B1 * | 5/2001 | Ying et al. ................ 205/324 |
| 6,359,288 B1 * | 3/2002 | Ying et al. ................ 257/14 |
| 7,084,002 B2 * | 8/2006 | Kim et al. ................ 438/104 |

OTHER PUBLICATIONS

X. Li, F. Cheng, B. Guo, J. Chen. Template-Synthesized LiCoO2, LiMn2O4, and LiNi0.8Co0.2O2 Nanotubes as Cathode Materials of Lithium Ion Batteries, J. Phys. Chem. B, 2005, 109, 14017-14024.*
J.B. Lee, S.C. Lee, H.J. Kim. H2 Uptake and Synthesis of the Li-dispersed Manganese Oxide Nanotubes, J. Nanosci. Nanotech., 2007, 7(11), 4033-4036.*

(Continued)

*Primary Examiner*—Jerry Lorengo
*Assistant Examiner*—Carlos Barcena

(57) ABSTRACT

The present invention relates to methods for manufacturing manganese oxide nanotubes/nanorods using an anodic aluminum oxide (AAO) template. In the inventive methods, the manganese oxide nanotubes/nanorods are manufactured in mild conditions using only a manganese oxide precursor and an anodic aluminum oxide template without using any solvent. The nanotubes/nanorods having uniform size can be easily obtained by adsorbing the manganese oxide precursor onto the surface of the anodic aluminum oxide template by a vacuum forming process using a vacuum filtration apparatus so as to maintain the shape of nanotubes/nanorods and drying the manganese oxide nanotubes. The manganese oxide nanotubes/nanorods made according to the inventive methods can be used as economic hydrogen reservoirs, the electrode of lithium secondary batteries, or the energy reservoirs of vehicles or other transport means.

6 Claims, 8 Drawing Sheets

OTHER PUBLICATIONS

Y. Zhou and H. Li. Sol-Gel Template Synthesis of Highly Ordered LiCo0.5Mn0.5O2 Nanowire Arrays and Their Structural Properties, 2002, J. Solid State Chem., 165, 247-253.*

Y. Zhou, C. Shen, J. Huang, H. Li. Synthesis of high-ordered LiMn2O4 nanowire arrays by AAO template and its structural properties, 2002, 77-82.*

* cited by examiner

| XRD | measured d value(Å) | JCPDS |
|---|---|---|
| 111 | 4.7162 | 4.764 |
| 311 | 2.4519 | 2.5467 |
| 400 | 2.0369 | 2.0621 |

METHOD FOR MANUFACTURING MANGANESE OXIDE NANOTUBE OR NANOROD BY ANODIC ALUMINUM OXIDE TEMPLATE

This application claims the benefit under 35 U.S.C. Section 371, of PCT International application no. PCT/KR2006/004278, filed Oct. 20, 2006, which claimed priority to Korean application nos. 10-2005-010544, filed Oct. 27, 2005 and 10-2006-0101153, filed Oct. 18, 2006, in Republic of Korea, the contents of which are incorporated herein by reference.

TECHNICAL FIELD

The present invention relates to a method capable of manufacturing manganese oxide nanotubes or nanorods in an economic and efficient manner using only an anodic aluminum oxide template (AAO) and a manganese oxide precursor without using any solvent.

BACKGROUND ART

Till now, there have been many attempts to synthesize nanostructures using an anodic aluminum oxide (hereinafter, referred to as "AAO") template, including the synthesis of carbon nanotubes in the AAO template by chemical vapor deposition, the formation of sodium nanotubes in the inner wall of the AAO template, and the synthesis of $LiMn_2O_4$ nanowires using the AAO template.

In general, one of the advantages of methods for manufacturing (synthesizing) nanostructures using the AAO template is that the manufactured nanostructures have a straight and uniform cylindrical shape and are highly dense. The AAO template does not participate directly in a reaction for producing nanotubes/nanorods, but has many effects on the physical shape of nanostructures.

The nanostructures can be used for various purposes in various industrial fields, and typically serve as energy reservoirs for storing hydrogen.

Hydrogen is recognized as infinite clean resources having little or no possibility of exhaustion, because it can be obtained from water on the earth and is recycled to water after combustion. Because hydrogen (energy) is clean energy that does not generate any pollutant other than water in combustion, it can be used in almost all fields, including various transport means or power plant systems.

However, one problem in the use of such hydrogen energy is that a convenient, economic and safe hydrogen storage system is not yet developed.

One of conventional hydrogen storage methods includes a physical method of compressing and storing hydrogen in a high-pressure container under a pressure higher than 100 atm, but the use of such a high-pressure container on transfer means is very risky in terms of safety. Another physical method for storing hydrogen includes a method of storing hydrogen at a very low temperature lower than the boiling point (20.3 K) thereof. This method is advantageous in that it can store a large amount of hydrogen by reducing the volume of hydrogen stored, but it is very disadvantageous in economic terms, because an additional system (refrigeration system) for maintaining very low temperatures is required.

Meanwhile, a chemical method for storing hydrogen using a hydrogen storage alloy has an advantage of high hydrogen storage efficiency, but it has problems in that, the storage and release of hydrogen are repeatedly carried out, the deformation of the hydrogen storage alloy will be induced by impurities, and thus the hydrogen storage capacity thereof will be reduced with the passage of time. In addition, because the alloy is used as a hydrogen storage medium, the weight per unit volume thereof is increased, thus making it difficult to use the hydrogen storage medium on transport means.

Still other methods for storing hydrogen include methods adsorbing and storing gaseous hydrogen in a solid material. Various reports on the efficiency of methods of storing hydrogen using carbon nanotubes or carbon nanostructure materials among such adsorption methods show hydrogen storage efficiencies much higher than 10 wt %, but such results lack reproducibility, and thus many studies are still ongoing.

Accordingly, many studies are currently ongoing to develop a hydrogen storage method, which ensures a hydrogen storage efficiency of more than 6.5%, a hydrogen storage target set by the US Energy Department of Energy (DOE), and safety and economic efficiency, and eliminates the above-mentioned problems.

Lithium secondary batteries, which are the energy sources of electronic information telecommunication devices and small-size devices, comprise positive and negative electrodes made of a material capable of reversibly intercalating and deintercalating lithium ions, are prepared by pouring an organic electrolyte or polymer electrolyte between the positive electrode and negative electrode, and produce electrical energy by oxidation/reduction reactions when lithium ions are intercalated into and deintercalated from the positive and negative electrodes. As the negative electrode active material of the lithium secondary battery, a carbon-based material such as amorphous carbon or crystalline carbon is mainly used. The positive electrode active materials include $LiCoO_2$, $LiNiO_2$ and $LiMn_2O_4$, which have a layered structure or include a tunnel-shaped space in the crystal thereof so as to permit the absorption and release of lithium ions. Manganese oxide-based based positive electrode active materials are unstable to temperature variations, but they are frequently used, because they are inexpensive, environmentally harmless, and show high energy density, compared to other active materials.

In lithium ion secondary batteries, the charge/discharge capacity of the positive electrode varies on the size and structure of particles. Specifically, as the particle size of the active material is decreased, the diffusion rate of lithium ions can be increased to increase the charge/discharge capacity of the positive electrode. Also, even when the active material has a particle structure in which the diffusion of lithium ions easily occurs, the charge/discharge capacity of the positive electrode itself can be increased. Moreover, the stability of the crystal structure has a close connection with reversibility, and has a close connection with the cycle life of the battery. Accordingly, preparation of powder, which contains no foreign matter and has excellent crystallinity, is a key technology for determining battery performance.

However, prior methods of preparing composite metal oxides have problems in that various complex steps are carried out and many facilities and long time are required. Also, in the prior methods of synthesizing composite metal oxides, the temperature of the synthesis is high, the particle size of reaction materials is relatively large, it is difficult to control the physical properties (e.g., particle shape or surface characteristics) of active materials, and limited starting materials such as oxides must be used. Accordingly, if pure $LiMn_2O_4$.based compounds in the form of nanotubes can be obtained by a simple preparation method, they can be applied as the positive-electrode active material of lithium secondary batteries.

Till now, there has been no example in which compounds in the form of nanotubes were used as the positive-electrode active material of secondary batteries.

DISCLOSURE OF INVENTION

Technical Problem

It is an object of the present invention to provide methods capable of effectively manufacturing manganese oxide nanotubes/nanorods having uniform nanosized pores in mild conditions using only a manganese oxide precursor and an anodic aluminum oxide template without using any solvent.

Another object of the present invention is to provide a lithium secondary battery having high charge/discharge capacity, long cycle life and thus excellent performance, which comprises the lithium-containing manganese oxide nanotubes manufactured by said methods.

Technical Solution

To achieve the above objects, the present invention provides a method for manufacturing manganese oxide nanotubes, the method comprising: a vacuum filtration step of vacuum-filtering a manganese oxide precursor through an AAO template inserted between a vacuum unit and a storage unit to adsorb the manganese oxide precursor onto the surface of the AAO template; an oxidizing step of heating and drying the manganese oxide precursor-adsorbed AAO template after the vacuum filtration step so as to oxidize the manganese oxide precursor adsorbed onto the surface of the template; a dissolving step of immersing the oxidized manganese oxide-adsorbed AAO template in an aqueous NaOH or KOH solution after the oxidizing step so as to dissolve only the AAO template; a filtering step of separating the solid manganese oxide nanotubes from the AAO solution produced in the dissolving step; a drying step of drying the manganese oxide nanotubes separated from the AAO solution; and a calcining step the dried manganese oxide nanotubes to remove impurities.

According to another aspect of the present invention, there is provided a method for manufacturing manganese oxide nanorods, the method comprising the steps of: treating the surface of the AAO template with silane to modify the surface, mounting the surface-treated AAO template into a vacuum forming apparatus, and sequentially conducting the steps of said method for manufacturing manganese oxide nanotubes. The step of treating the AAO template with silane may comprise: an immersion step of immersing 0.174 g of the anodic aluminum oxide template in a mixed solution of 1.8-9 g of $H_2O$, 1.89-8.96 g of 3-aminopropyl trimethoxysilane and 50-500 mL of lower alcohol for 5-20 minutes and taking the immersed AAO template out of the mixed solution; a first drying step of washing the surface of the AAO template with lower alcohol after the immersion step and then blowing inert gas onto the surface of the AAO template; and a second drying step of treating the dried AAO template at a temperature of 80-120° C. for 5-10 minutes. As used herein, the term "lower alcohol" refers to a C1-C5 alcohol, such as methanol, ethanol, isopropanol or the like.

As the manganese oxide precursor in the vacuum filtration step, $Mn(NO_3)_2 \cdot H_2O$ was used in Examples of the present invention, the present invention is not limited thereto, and any material can be used in the present invention, as long as it can be adsorbed onto the AAO template to form manganese oxide during the drying step and is a liquid phase that does not need to be dissolved in a solvent before use. According to the embodiment of the present invention, pure manganese oxide nanotubes having uniform nanosized pores can be synthesized in mild conditions without using any solvent, unlike the prior processes for manufacturing nanotubes. If a solvent is used, the solvent or a trace amount of other components contained in the solvent can act as impurities; however, according to the present invention, any solvent is not used, and thus there is no concern about impurities caused by the solvent.

Also, the AAO template preferably has a pore size of 180-250 nm and a thickness of 40-80□. If a template having an average pore size of less than 180 nm is used, the shape of the resulting nanotubes will not be correctly formed. On the other hand, an AAO template having a pore size of more than 250 nm is unsuitable for forming nanostructures, particularly nanostructures for use as energy reservoirs.

In the vacuum filtration step, the manganese oxide precursor must be used in an amount that can sufficiently wet the AAO template, and thus the amount of use of manganese oxide precursor is determined depending on the size of the template. If the template is not sufficiently wetted, the manganese oxide precursor will not be adsorbed onto the non-wetted portion, and thus the manganese oxide precursor must be sufficiently used such that it can completely wet the template. Because a portion of the manganese oxide precursor that remains after adsorption onto the template is removed, the manganese oxide precursor may be used in excess. In this case, however, a great loss in economic terms is incurred, and thus the manganese oxide precursor is preferably used in suitable amounts, considering the size of the AAO template.

The oxidizing step of oxidizing the manganese oxide precursor is preferably carried out at a temperature of 80-150° C. in the presence of oxygen for 1-4 hours, such that the adsorbed manganese oxide precursor can be sufficiently oxidized. As used herein, the phrase "In the presence of oxygen" means that oxygen to react with the manganese oxide precursor must be present in the thermal treatment of the precursor. Accordingly, although oxygen gas charged into a dryer may also be used for the supply of oxygen in the thermal treatment of the precursor, it causes an economic burden, and for this reason, the thermal treatment of the precursor is sufficiently carried out in the presence of the presence of air.

The concentration of the aqueous NaOH or KOH solution, which is used in the dissolution step, is preferably 1-5 M. The aqueous solution is preferably used in an amount of more than 50 mL per 0.174 g of the AAO template, such that it can sufficiently dissolve the AAO template.

The AAO template dissolved in the dissolution step is separated by filtration from manganese oxide nanotubes remaining as a solid. The nanotubes are sufficiently washed with purified water in the filtering step, such that the NaOH or KOH solution containing the AAO template dissolved therein does not remain in the nanotubes.

The manganese oxide nanotubes obtained in the filtering step according to the present invention contain a small amount of water, and thus they are dried at a temperature of 80-150° C. for 1-4 hours to remove water. After drying, the manganese oxide nanotubes are calcined at a temperature of 450-550 for 2-3 hours, so that not only water, but also impurities remaining in the nanotubes, can be removed.

The manganese oxide nanotubes obtained through the drying and calcining steps are immersed in a solution of a lithium precursor dissolved in distilled water, and then only the manganese oxide nanotubes adsorbed with lithium are separated from the solution are dried in a dry atmosphere under reduced pressure. Then, the lithium-adsorbed manganese oxide nanotubes are oxidized by thermal treatment at a temperature of 80-150° C. in the presence of oxygen for 1-4 hours. Then, the oxidized nanotubes are calcined in an electric furnace at 450-550° C. for 2-3 hours. In this way, the manganese oxide nanotubes containing lithium can be manufactured.

Although Examples of the present invention were described only with respect to the manufacture of $Mn_2O_3$ nanotubes, manganese oxide nanotubes having oxidation numbers that vary depending on oxidation number and time and an oxidation atmosphere can be manufactured according to the present invention.

The lithium precursor may be lithium hydroxide, halide, nitrate, carbonate or sulfate, and the molar ratio of the manganese oxide precursor to the lithium precursor is preferably 1:0.1-10. More preferably, the lithium precursor is added at a molar ratio of 1:1-3 with respect to the manganese oxide precursor. The lithium-containing manganese oxide nanotubes according to the present invention can be applied as the material of lithium ion secondary batteries.

The concentration of the aqueous solution of the lithium precursor is preferably 0.1-5 M. If the concentration of the aqueous solution is too low, the efficiency for adding lithium to the manganese oxide nanotubes can be decreased, and if the concentration of the aqueous solution is too high, the manganese oxide nanotubes will not be sufficiently immersed in the aqueous lithium solution, when the manganese oxide precursor and the lithium precursor are used at the above-described molar ratio.

Although many studies on electrode materials comprising lithium oxide nanoparticles have been conducted to date, studies on electrode materials comprising nanotubes have been partially conducted. The positive-electrode active materials of currently commercially available lithium ion secondary batteries include $LiCoO_2$, $LiMnO_2$ and the like, and these materials are characterized by high crystallinity. If the crystallinity of the positive-electrode active material is high, the structure of the active material will be broken due to a change in volume caused by the charge/discharge of batteries, and stress caused by the volume change, and the batteries cannot show theoretically attainable capacity and will have short cycle life. The positive-electrode material composed of the nanotubes is expected to solve these problems, have low crystallinity, stably maintain the structure thereof, and thus improve the charge/discharge cycle of batteries.

ADVANTAGEOUS EFFECTS

According to the present invention, nanotubes or nanorods having uniform size can be manufactured in mild conditions using a transition metal precursor and an AAO template without using a solvent, which has acted as an impurity in the manufacture of metal nanotubes according to the prior art.

DESCRIPTION OF REFERENCE NUMERALS

1: storage unit 2: template
3: holder 4: vacuum unit.

BEST MODE FOR CARRYING OUT THE INVENTION

Hereinafter, the construction, operation and effect of the present invention will be described in detail with reference to the accompanying drawings and examples below. It is to be understood, however, that these examples are for illustrative purposes only and are not to be construed to limit the scope of the present invention.

EXAMPLES

Example 1

Manufacture of Manganese Oxide Nanotubes

In this Example, to manufacture manganese oxide nanotubes, manganese (II) nitrate hydrate ($Mn(NO_3)_2 \cdot xH_2O$, 98%; Aldrich) was used and Anodic 47 (Whatman) was used as a template. The main component of the template was anodic aluminum oxide (AAO), and the important physical properties of the template are shown in Table 1 below.

Figure 5:
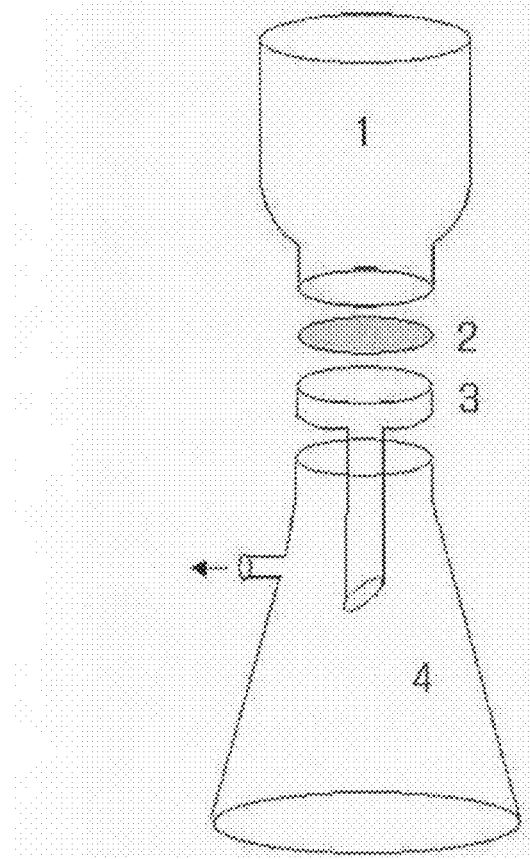
FIG. 5 is a schematic diagram showing a vacuum filtration apparatus for use in the manufacture of manganese oxide nanotubes according to the present invention.

As shown in FIG. 5, an AAO template was first inserted between a storage unit 1 and a holder 3 in a vacuum forming system and attached tightly attached to the system. Then, 1.79 g of $Mn(NO_3)_2 \cdot xH_2O$ was put in the storage unit 1, and the pressure of a vacuum unit 4 was reduced by exhausting the inside of the vacuum unit using a gas-intake device such as a vacuum pump.

Thus, as the internal pressure of the vacuum unit 4 was lowered, most of $Mn(NO_3)_2 \cdot xH_2O$ filled in the storage unit flowed toward the vacuum unit 4 through the template 2, and a portion thereof was adsorbed onto the surface of the template 2. The vacuum unit was maintained under reduced pressure for about 10 minutes, such that Mn(NO$_3$)$_2$.xH$_2$O did not remain in the pores of the template.

Then, the template 2 was separated from the vacuum forming system and dried in a vacuum dryer at about 40° C. for 20 minutes. The dried template was additionally dried in an air atmosphere at about 100° C. for 3 hours, such that it was sufficiently oxidized.

Then, the oxidized template adsorbed with the manganese oxide precursor was immersed in 60 ml of a 1 M NaOH solution for about 1 hour to dissolve the template 2. Then, the template solution was sufficiently washed with distilled water and separated into a liquid component (solution portion) and a solid component (nanotubes).

The obtained solid component contained some water, and thus was heated at about 100° C. in an air atmosphere for 3 hours to remove water and calcined at about 500° C. for about 2 hours, thus obtaining manganese oxide nanotubes consisting of nanosized manganese oxide particles.

TABLE 1

| | Anodic 47 |
| --- | --- |
| Average membrane thickness | 60 μm |
| Membrane diameter | 43 nm |
| Membrane type | Anopore aluminum oxide |
| Support ring material | Polypropylene |
| Construction process | Thermal weld |
| Protein adsorption | Low |
| Burst strength | 65-100 psi |
| Maximum service temperature | 400° C. |
| Porosity | 25-50% |
| Autoclavable | No |
| Refractive index | 1.6 |

Figure 1:
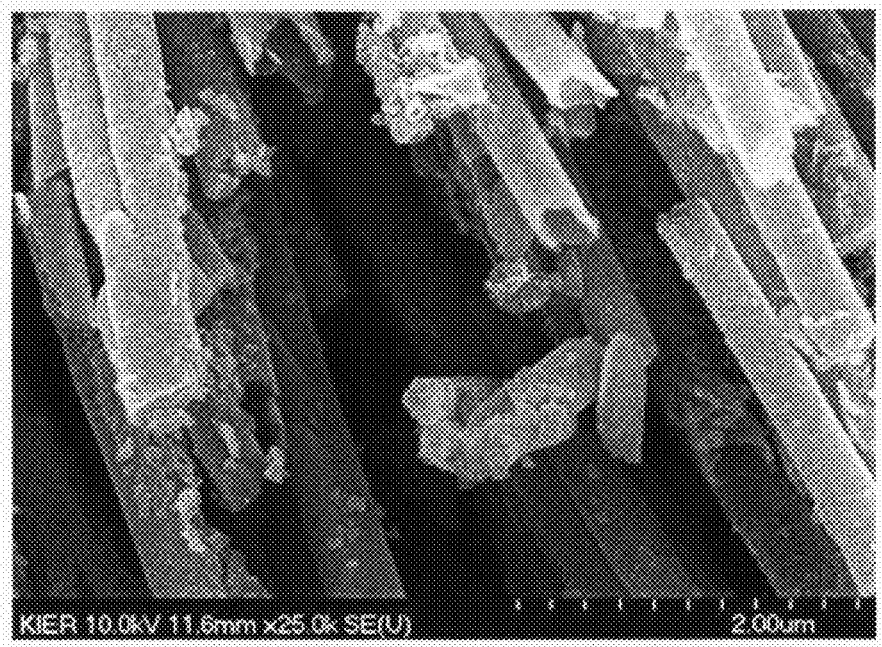
FIG. 1 is a SEM photograph of manganese oxide nanotubes according to one embodiment of the present invention.
Figure 2:
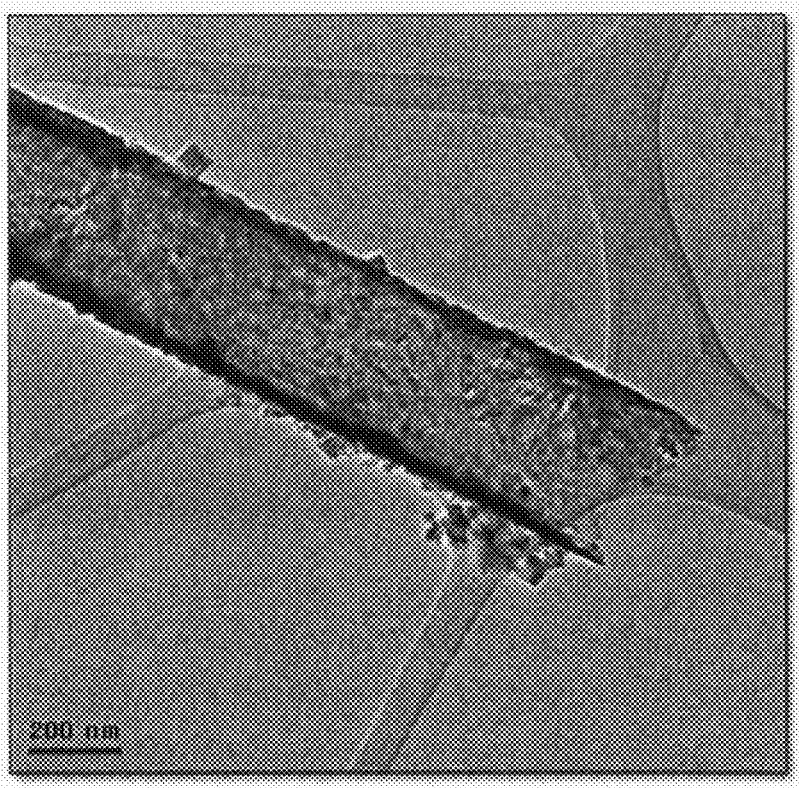
FIG. 2 is a TEM photograph of manganese oxide nanotube according to one embodiment of the present invention.

FIGS. 1 and 2 show a SEM (scanning electron microscopy) photograph and TEM (transmission electron microscopy) photograph of the manganese oxide nanotubes made according to the method of this Example. As can be seen in the photographs, the manganese oxide nanotubes manufactured in this Example included walls consisting of nanosized particles, and had uniform size and a very large surface area, indicating that the nanotubes had a structure very advantageous to store hydrogen.

Figure 3:
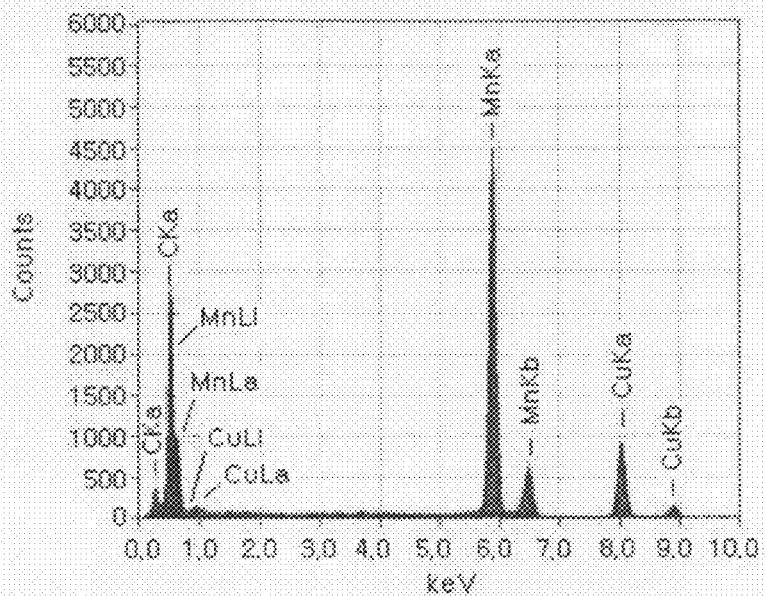
FIG. 3 is a graphic diagram showing the energy-dispersion spectrum of manganese oxide nanotubes according to one embodiment of the present invention.
Figure 3:
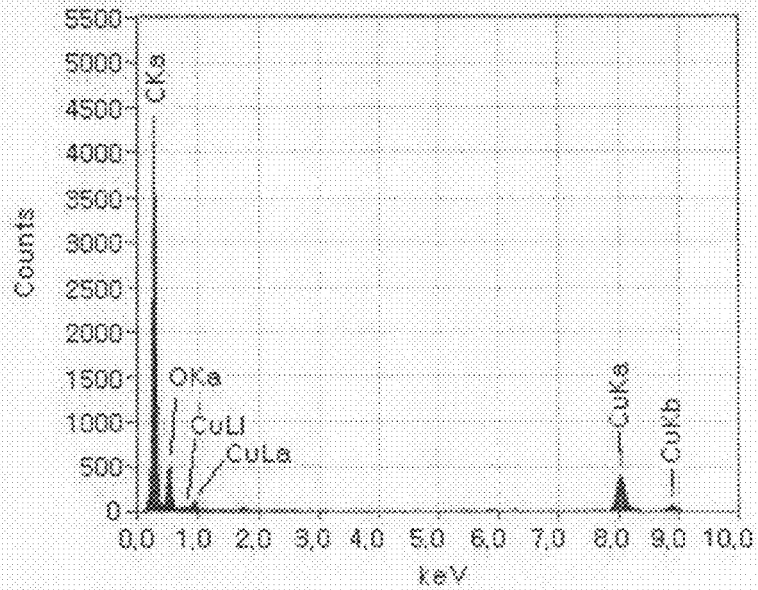
Figure 4:
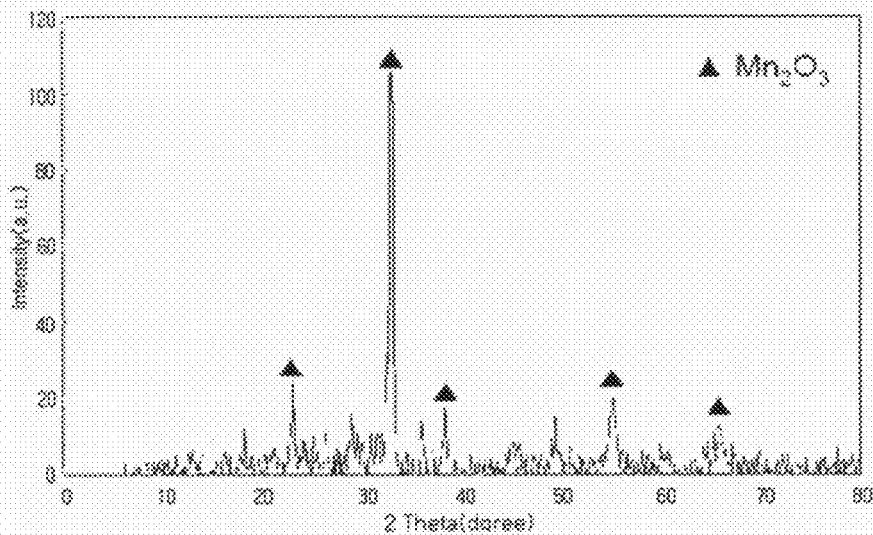
FIG. 4 is a graphic diagram showing the X-ray diffraction pattern of manganese oxide nanotubes according to one embodiment of the present invention.

FIG. 3 is a graphic diagram showing the energy-dispersion spectrum of the manganese oxide nanotubes manufactured in this Example, and as can be seen in FIG. 3, the nanotubes consisted of only manganese and oxygen. As can be seen in FIG. 4, the manufactured manganese oxide nanotubes had a Mn$_2$O$_3$ structure.

Example 2

Manufacture of Manganese Oxide Nanorods

Manganese (II) nitrate hydrate (Mn(NO$_3$)$_2$.xH$_2$O, 98%; Aldrich) was used as a manganese oxide precursor, and Anodic 47 (Whatman), the surface of which was treated with 3-aminopropyl trimethoxysilane, was used as a template.

The template was first surface-treated by immersion in a mixed solution of 5 g of H$_2$O, 180 g of 2-propanol and 5 g of 3-aminopropyl for 10 minutes. Then, the template was taken of the mixed solution, the surface thereof was washed with 2-propanol solution and naturally dried by blowing with N$_2$ gas, and the template was dried by heating at 100° C. for 8 minutes. The above-described procedures were repeated three times.

Then, the surface-treated template was filtered through the vacuum filtration apparatus used in the above-described manufacture of manganese oxide nanotubes and was subjected to the same process as in Example 1, thus manufacturing manganese oxide nanorods.

Figure 6:
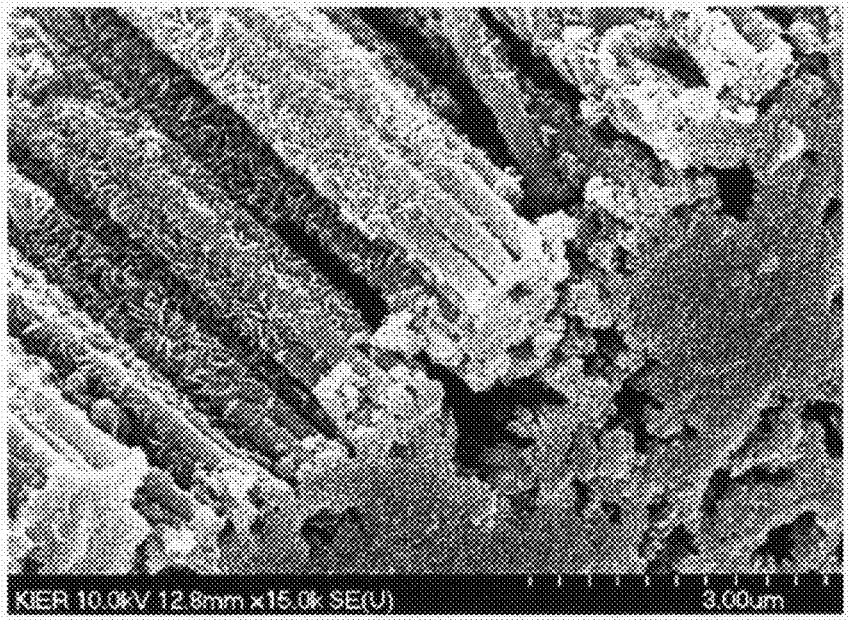
FIG. 6 is a SEM photograph of manganese oxide nanorods manufactured according to another embodiment of the present invention.
Figure 7:
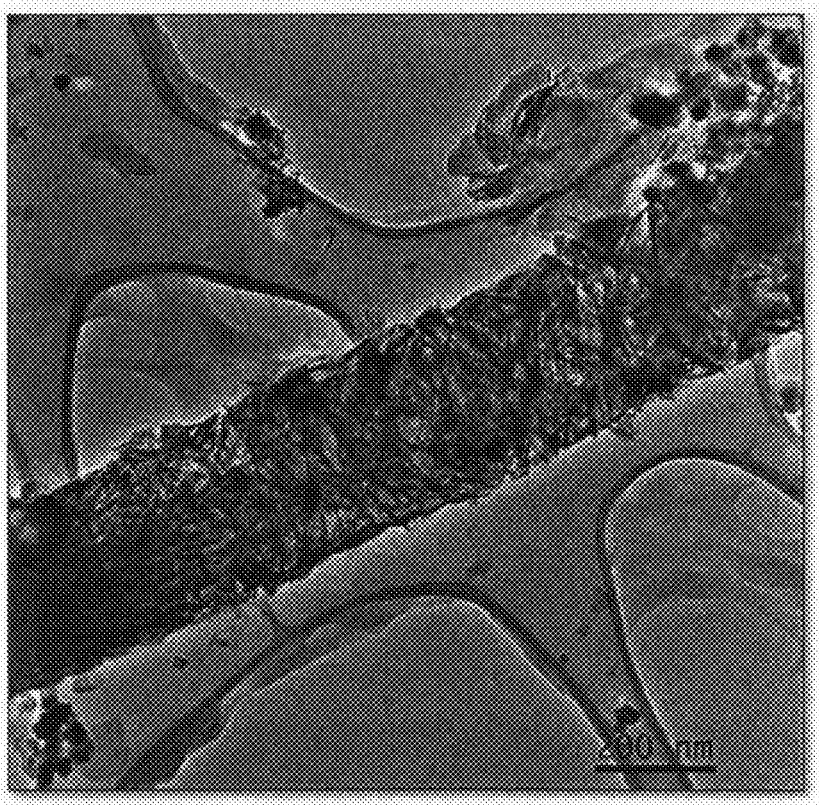
FIG. 7 is a TEM photograph of manganese oxide nanorods manufactured according to another embodiment of the present invention.

FIGS. 6 and 7 show a SEM (scanning electron microscopy) photograph and TEM (transmission electron microscopy) photograph of the manganese oxide nanorods made according to the method of this Example. As can be seen in the photographs, the manganese oxide nanorods manufactured by passing the manganese oxide precursor through the silane-treated AAO template mounted on the vacuum forming apparatus had a structure consisting of a number of nanosized flakes.

Comparative Example 1

Preparation of Manganese Oxide Particles Using Manganese Oxide Precursor in Aqueous Solution Manganese (II) nitrate hydrate (Mn(NO$_3$)$_2$.xH$_2$O, 98%; Aldrich) was used as a manganese oxide precursor, and Anodic 47 (Whatman) was used as a template.

Manganese oxide particles were prepared in the same process as in Example 1, except that 0.01 mol of the manganese oxide precursor dissolved in 1 ml of distilled water was used.

Figure 8:
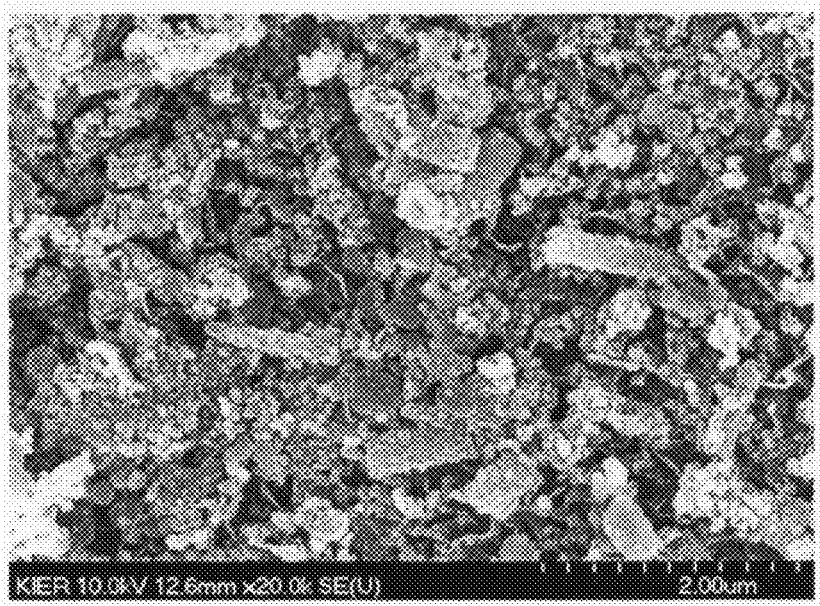
FIG. 8 is a SEM photograph of manganese oxide particles prepared by dissolving a manganese oxide precursor in distilled water.

FIG. 8 shows a SEM (scanning electron microscopy) photograph of the manganese oxide particles made according to the method of this Comparative Example 1. As can be seen in FIG. 8, when the manganese oxide precursor dissolved in distilled water was used, any shape of tubes or rods was not formed.

Example 3

Manufacture of Lithium-Containing Manganese Oxide Nanotubes

The manganese oxide nanotubes manufactured in Example 1 was immersed in a 1 M aqueous solution of lithium nitrate (LiNO$_3$) for 1 hour, and only manganese oxide nanotubes adsorbed with lithium were separated from the solution and dried in a vacuum dryer at 40° C. for 4 hours. Then, the lithium-adsorbed manganese oxide nanotubes were dried in a dryer at 100° C. in an air atmosphere for 3 hours, and the dried lithium-adsorbed manganese oxide nanotubes were calcined in an electric furnace at 500° C. in an air atmosphere for 2 hours, thus manufacturing lithium-containing manganese oxide nanotubes.

Figure 9:
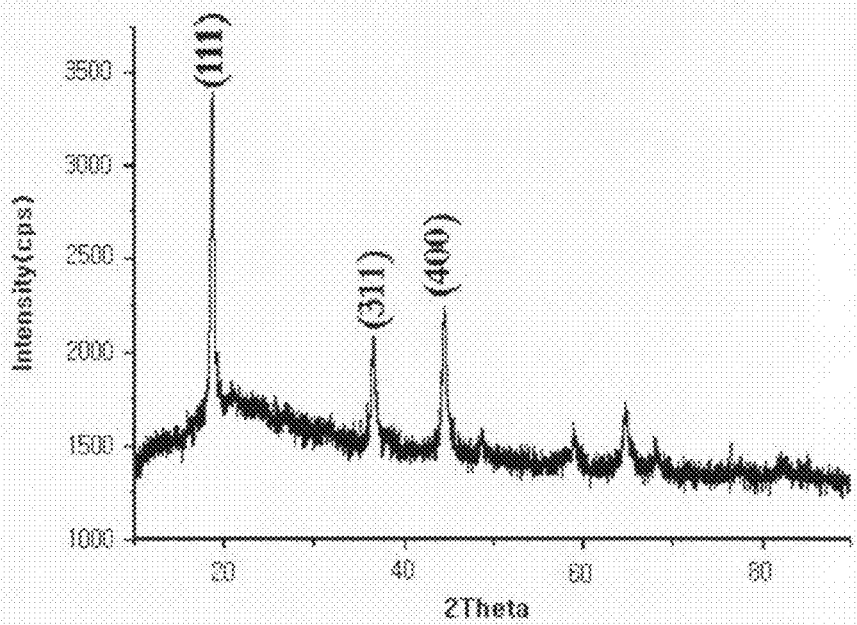
FIG. 9 is a graphic diagram showing the X-ray diffraction pattern of lithium-containing manganese oxide nanotubes according to one embodiment of the present invention.
Figure 10:
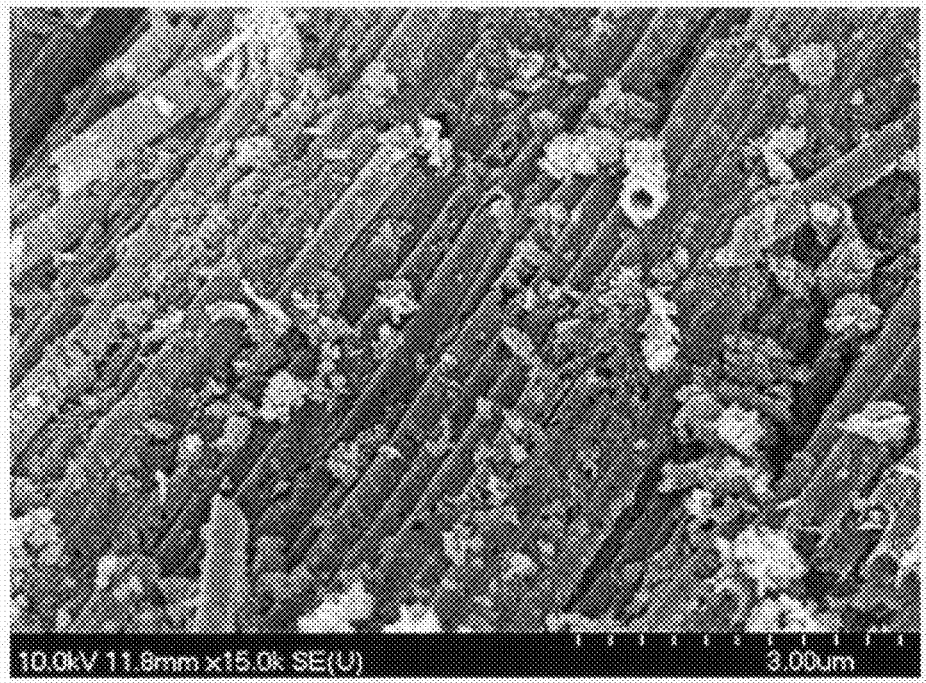
FIG. 10 is a SEM photograph of lithium-containing manganese oxide nanotubes according to one embodiment of the present invention.

FIG. 9 is a graphic diagram showing the X-ray diffraction pattern of the lithium-containing manganese oxide nanotubes. As can be seen in FIG. 9, the manganese oxide nanotubes showed the typical X-ray diffraction pattern of lithium manganese oxide (LiMn$_2$O$_4$). FIG. 10 is a SEM photograph of the lithium-containing manganese oxide nanotubes. As can be seen in FIG. 10, the shape of the nanotubes was maintained even when lithium was added thereto.

The lithium-containing manganese oxide nanotubes were simulated by a molecular dynamic method through energy minimization.

Figure 11:
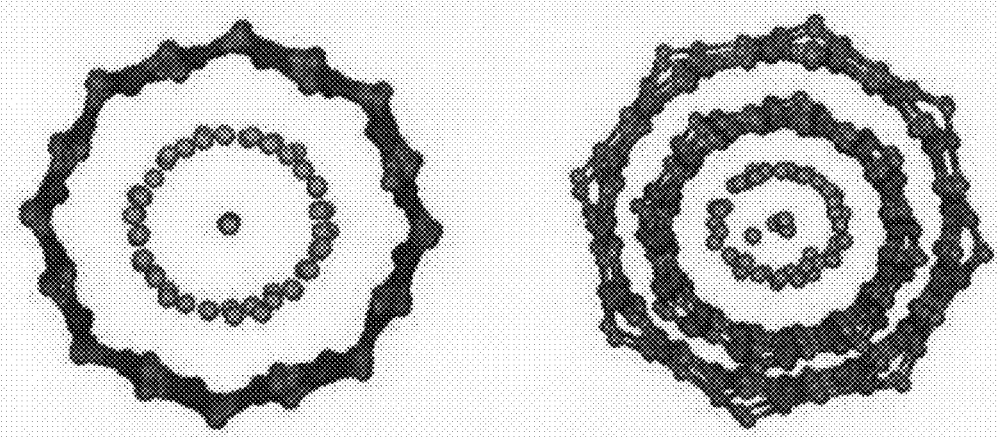
FIG. 11 is a schematic diagram showing the computer simulation of $LiMnO_2$ nanotubes.

FIG. 11 shows the results of computer simulation of the LiMnO$_2$ nanotubes. As can be seen in FIG. 11, lithium ions were present in the space of the manganese oxide nanotubes.

Example 4

Test of Electrical Capacity of Secondary Battery Comprising Lithium-Containing Manganese Oxide Nanotubes The manganese oxide nanotubes manufactured in Example 3, Super P Black and PVDF (polyvinylidine difluoride) were mixed with each other at a weight ratio of 85:10:5, and PVDF/NMP (N-methyl-2-pyrrolidone) as a binder was added thereto at a ratio of 4%, thus preparing an electrode mix. The electrode mix was applied on one side of a copper thin film having a thickness of 10□. Then, the resulting film was dried at 100° C. for 10 hours, cooled to room temperature, and compressed from a thickness of 60□ to 40□ (a level of about 70%). The compressed film was punched using a 10 mm-thick disc, and a 2032 battery was constructed using a lithium counter electrode (FMC) and a separator (Tonen).

Figure 12:
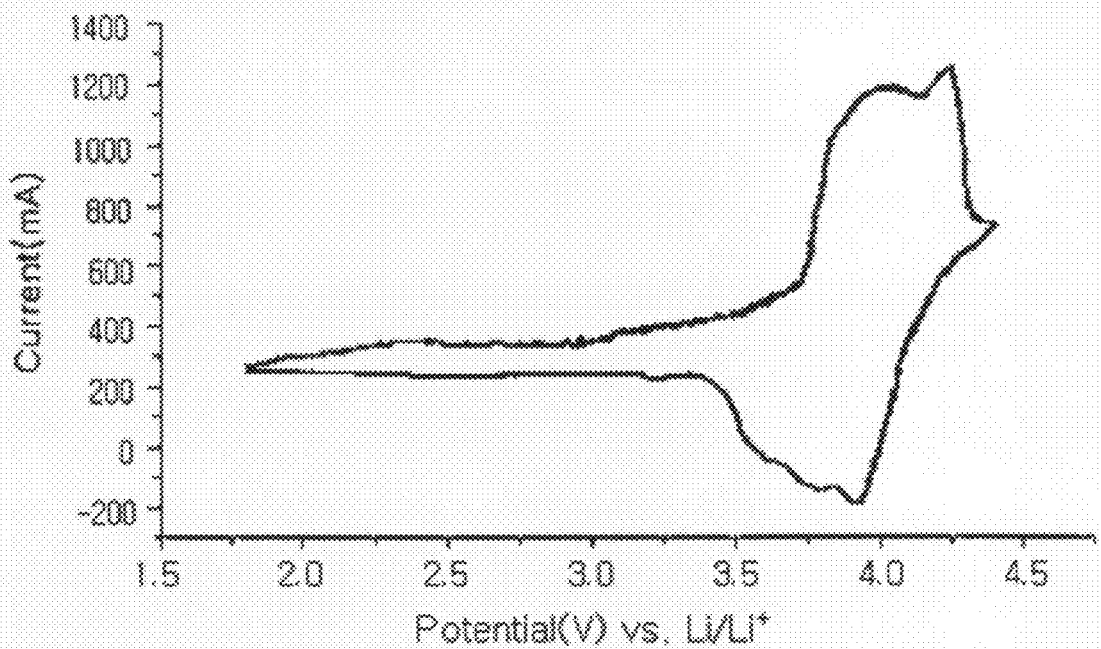
FIG. 12 is a cyclic voltammogram measured at a scan rate of 0.02 mV/sec for a lithium secondary battery manufactured in Example 4.
Figure 13:
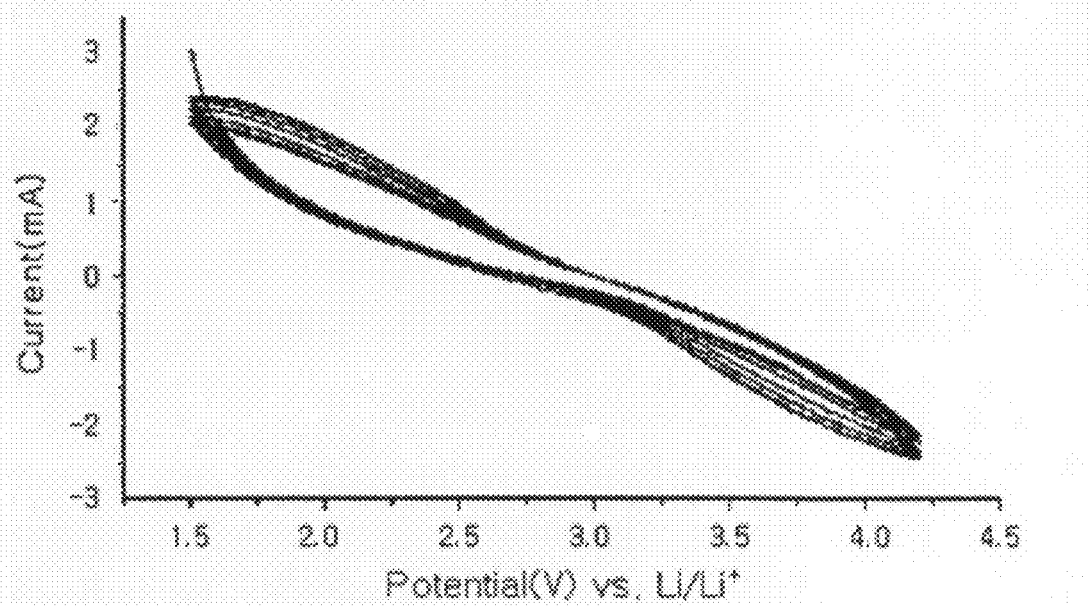
FIG. 13 is a cyclic voltammogram measured at a scan rate of 0.02 mV/sec for a lithium secondary battery manufactured in Example 4.

In order to examine the redox characteristics (i.e., electrochemical reactivity and stability) of the $LiMn_2O_4$ electrode in the lithium secondary battery manufactured in this Example, the voltammogram of the secondary battery was measured and the measurement results are shown in FIGS. 12 and 13. FIG. 12 is a cyclic voltammogram measured at a scan rate of 0.02 mV/sec and a potential ranging from 1.8V to 4.2V in a 1M LiPF6 EC (ethylene carbonate)/EMC (ethylmethyl carbonate) electrolyte salt as the liquid electrolyte of the lithium secondary battery. FIG. 13 is a cyclic voltammogram measured several times at a scan rate of 2 mV/sec and a potential ranging from 5.5V to 4.5V in the above liquid electrolyte.

Figure 14:
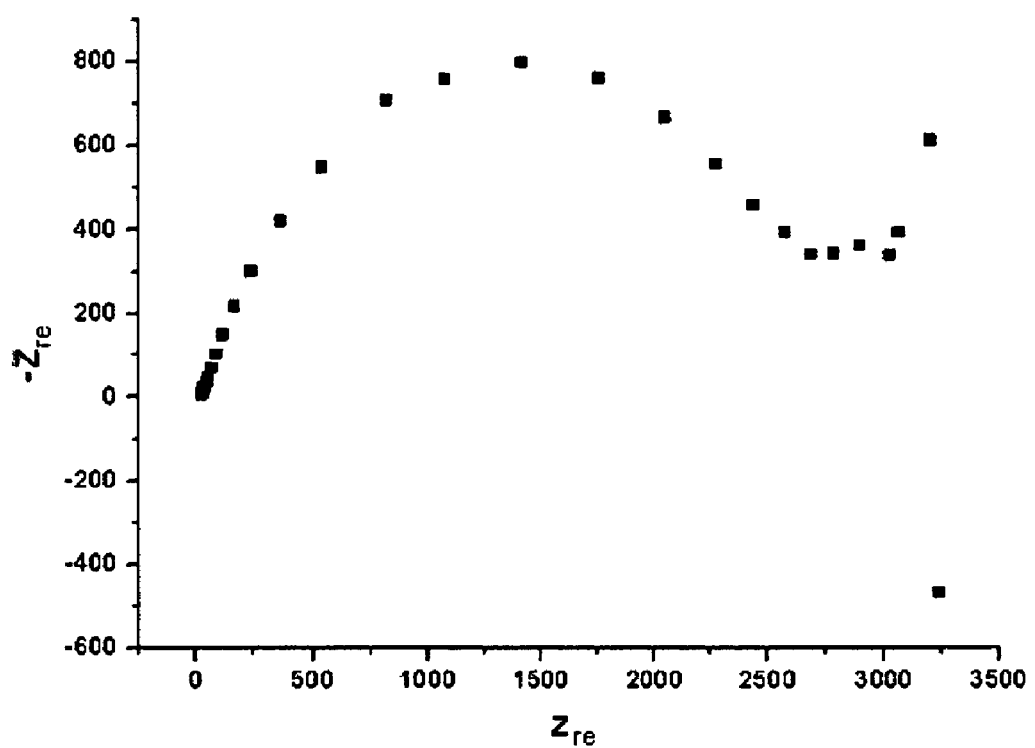
FIG. 14 is a graphic diagram showing the impedance characteristics according to oxidation/reduction potential of a $LiMn_2O_4$ electrode manufactured in Example 4.

FIG. 14 is a typical Nyquist graph obtained by measuring impedance characteristics according to the oxidation/reduction potential of the $LiMn_2O_4$ electrode. The frequency region is 5 mHz to 1000 kHz.

INDUSTRIAL APPLICABILITY

Transition metal nanotubes or nanorods obtained according to the manufacture method of the present invention have a very large specific area, and thus can store a large amount of hydrogen in a relatively small volume and can safely transport the stored hydrogen. Also, the nanotubes or nanorods can serve as hydrogen energy reservoirs and can be used as the electrode of lithium secondary batteries.

The invention claimed is:

1. A method for manufacturing manganese oxide nanotubes, the method comprising:
   vacuum-filtering a manganese oxide precursor through an anodic aluminum oxide (hereinafter "AAO") template inserted between a vacuum unit and a storage unit to prepare a manganese oxide precursor-adsorbed AAO template;
   oxidizing by heating and drying the manganese oxide precursor-adsorbed AAO template to prepare an oxidized manganese oxide-adsorbed AAO template;
   dissolving by immersing the oxidized manganese oxide-adsorbed AAO template in an aqueous NaOH or KOH solution to dissolve only the AAO template to dissolve the AAO template while manganese oxide nanotubes remain as solid;
   filtering by separating the manganese oxide nanotubes the AAO-dissolved solution;
   drying the manganese oxide nanotubes separated the AAO-dissolved solution to prepare dried manganese oxide nanotubes; and
   calcining the dried manganese oxide nanotubes.

2. The method of claim 1, wherein the manganese oxide precursor is $Mn(NO_3)_2 \cdot xH_2O$.

3. The method of claim 1, wherein the AAO template has a pore size of 180-250 nm and a thickness of 40-80 μm.

4. A method for manufacturing lithium-containing manganese oxide nanotubes, the method comprising:
   ion exchanging by adding a lithium precursor and water to the manganese oxide nanotubes of claim 1 by an impregnation process and conducting the ion exchange between the lithium precursor and the manganese oxide nanotubes to prepare lithium-containing manganese oxide nanotubes;
   vacuum-drying the lithium-containing manganese oxide nanotubes;
   oxidizing by thermally treating the lithium precursor added to the manganese oxide nanotubes; and
   calcining the lithium-containing manganese oxide nanotubes at a temperature of 450-550° C.

5. A method for manufacturing manganese oxide nanorods, the method comprising:
   vacuum-filtering a manganese oxide precursor through an anodic aluminum oxide (hereinafter "AAO"), template inserted between a vacuum unit and a storage unit to adsorb the manganese oxide precursor onto the surface of the MO template, in which the surface of the AAO template is modified by a silane treatment process comprising:
   immersing the AAO template in a mixed solution of 0.1-0.5 mol of $H_2O$, 0.01-0.05 mol of 3-aminopropyl trimethoxysilane and 1-5 mol of 2-propanol for 5-20 minutes and taking the immersed AAO template out of the mixed solution;
   washing the surface of the AAO template with a 2-propanol solution after immersing and then blowing inert gas onto the surface;
   drying by heating the AAO template resulting after washing at 80-120° C. for 5-10 minutes to prepare a manganese oxide precursor-adsorbed AAO template;
   oxidizing by heating and drying the manganese oxide precursor-adsorbed AAO template to prepare an oxidized manganese oxide-adsorbed AAO template;
   dissolving by immersing the oxidized manganese oxide-adsorbed AAO template in an aqueous NaOH or KOH solution to dissolve only the AAO template to dissolve the AAO template while manganese oxide nanorods remain as solid;
   filtering by separating the solid manganese oxide nanorods from AAO-dissolved solution;
   drying the manganese oxide nanorods separated from AAO-dissolved solution to prepare dried manganese oxide nanorods; and
   calcining the dried manganese oxide nanorods.

6. The method of claim 5, wherein the manganese oxide precursor is $Mn(NO_3)_2 \cdot xH_2O$.

* * * * *